US 6,583,479 B1

(12) United States Patent
Fastow et al.

(10) Patent No.: US 6,583,479 B1
(45) Date of Patent: Jun. 24, 2003

(54) SIDEWALL NROM AND METHOD OF MANUFACTURE THEREOF FOR NON-VOLATILE MEMORY CELLS

(75) Inventors: Richard M. Fastow, Cupertino, CA (US); Shane C. Hollmer, San Jose, CA (US); Pau-Ling Chen, Saratoga, CA (US); Michael Van Buskirk, Saratoga, CA (US); Masaaki Higashitani, Sunnyvale, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/688,936

(22) Filed: Oct. 16, 2000

(51) Int. Cl.[7] ............................................. H01L 31/062
(52) U.S. Cl. ..................................................... 257/390
(58) Field of Search ............................... 257/330, 390; 438/259

(56) References Cited

U.S. PATENT DOCUMENTS

| 4,173,766 A | | 11/1979 | Hayes ........................... 357/23 |
| 5,071,782 A | * | 12/1991 | Mori ............................. 438/259 |
| 5,077,691 A | | 12/1991 | Haddad et al. ................ 365/218 |
| 5,280,446 A | | 1/1994 | Ma et al. ....................... 365/185 |
| 5,349,221 A | | 9/1994 | Shimoji ......................... 257/324 |
| 5,554,550 A | * | 9/1996 | Yang ............................. 438/259 |
| 5,561,620 A | | 10/1996 | Chen et al. ................... 365/218 |
| 5,598,369 A | | 1/1997 | Chen et al. ............... 365/185.27 |
| 5,617,357 A | | 4/1997 | Haddad et al. ........... 365/185.27 |
| 5,675,537 A | | 10/1997 | Bill et al. ................. 365/185.22 |
| 5,708,588 A | | 1/1998 | Haddad et al. ............... 364/491 |
| 5,768,192 A | | 6/1998 | Eitan ....................... 365/185.24 |
| 5,790,456 A | | 8/1998 | Haddad ................... 365/185.17 |
| 5,805,502 A | | 9/1998 | Tang et al. ............... 365/185.29 |
| 5,825,686 A | | 10/1998 | Schmitt-Landsiedel et al. .. 365/185.03 |
| 5,888,867 A | | 3/1999 | Wang et al. .................. 438/257 |
| 6,093,606 A | * | 7/2000 | Lin et al. ...................... 438/259 |
| 6,114,205 A | * | 9/2000 | Mori ............................. 438/270 |
| 6,143,636 A | * | 11/2000 | Forbes et al. ................ 438/259 |
| 6,190,968 B1 | * | 2/2001 | Kalnitsky et al. ............ 438/259 |
| 6,191,459 B1 | * | 2/2001 | Hofmann et al. ............ 257/390 |
| 6,204,123 B1 | * | 3/2001 | Mori ............................. 438/259 |
| 6,319,777 B1 | * | 11/2001 | Hueting et al. .............. 438/270 |

FOREIGN PATENT DOCUMENTS

| GB | 2157489 | 3/1985 |
| WO | WO 99/07000 | 8/1998 |

OTHER PUBLICATIONS

T.Y. Chan, K.K. Young and Chenming Hu, "A True Single Transistor Oxide–Nitride–Oxide EEPROM Device", IEEE Electron Device Letters, Vo. EDL–8, No. 3, Mar. 1987.

* cited by examiner

Primary Examiner—Carl Whitehead, Jr.
Assistant Examiner—David S Blum

(57) ABSTRACT

An non-volatile read only memory transistor for use in a memory array is disclosed. The non-volatile read only memory transistor features a substantially vertically oriented channel fabricated in a trench formed in the substrate. The channel length is dependent upon the depth of the trench and therefore a dense array of NROM transistors can be formed without adversely affecting the channel length and therefore the operational performance of the transistor.

12 Claims, 11 Drawing Sheets

SIDEWALL NROM AND METHOD OF MANUFACTURE THEREOF FOR NON-VOLATILE MEMORY CELLS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor EEPROM devices involve more complex processing and testing procedures than ROM, but have the advantage of electrical programming and erasing. Using EEPROM devices in circuitry permits in-circuit erasing and reprogramming of the device, a feat not possible with conventional EPROM memory. Flash EEPROMs are similar to EEPROMs in that memory cells can be programmed (i.e., written) and erased electrically but with the additional ability of erasing all memory cells at once, hence the term flash EEPROM.

An example of a single transistor Oxide-Nitrogen-Oxide (ONO) EEPROM device is disclosed in the technical article entitled "A True Single-Transistor Oxide-Nitride-Oxide EEPROM Device," T. Y. Chan, K. K. Young and Chenming Hu, IEEE Electron Device Letters, March 1987. The memory cell is programmed by hot electron injection and the injected charges are stored in the oxide-nitride-oxide (ONO) layer of the device. This article teaches programming and reading in the forward direction. Thus, a wider charge trapping region is required to achieve a sufficiently large difference in threshold voltages between programming and reading. This, however, makes it much more difficult to erase the device.

An attempt to improve the erasure of such ONO EEPROM devices is disclosed in both U.S. Pat. No. 5,768, 192 and PCT patent application publication WO 99/07000, the contents of which are hereby incorporated herein by reference. In those disclosed devices, a cell is erased by applying a constant negative voltage to the gate over a plurality of cycles. However, the number of cycles and time to erase the memory cell can become large. Furthermore, the memory cell may become degraded should the number of cycles needed to erase the cell becomes too large. The slowing down of the erase speed is due to the trapping of electrons in the oxide layers or charge spill over into the nitride layer.

SUMMARY OF THE INVENTION

The present invention is defined by the following claims, and nothing in this section should be taken as a limitation on those claims. By way of introduction, the preferred embodiments described below relate to a non-volatile read only memory transistor. The transistor includes a channel having a first end comprising a source and a second end comprising a drain. The source being located in a first plane and the drain being located in a second plane with the second plane being oriented substantially parallel to the first plane. Wherein the channel is located in a third plane, the third plane being oriented substantially perpendicular to the first and second planes.

The preferred embodiments further relate to a method for fabricating a non-volatile read only memory device in a substrate. The method comprises: fabricating a trench in the substrate, the trench having a top portion, a bottom portion oriented substantially parallel to the top portion and a wall extending perpendicularly from the top portion to the bottom portion; fabricating a source in the bottom portion of the trench; fabricating a drain in the top portion of the trench; and fabricating a channel in the wall between the source and the drain.

DETAILED DESCRIPTION OF THE PRESENTLY PREFERRED EMBODIMENTS

Figure 1:
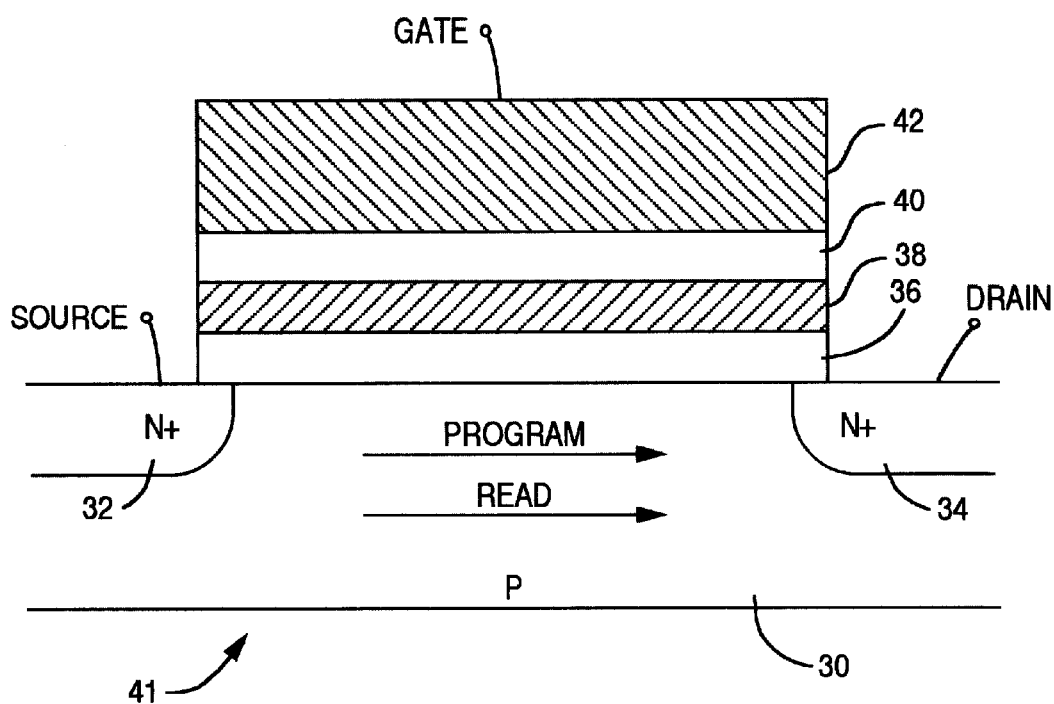
FIG. 1 illustrates a sectional view of a single bit flash EEPROM cell of the prior art utilizing Oxide-Nitride-Oxide (ONO) as the gate dielectric.

The structure of a two bit flash EEPROM cell that employs the method of erasure of the present invention can best be understood with an understanding of how single bit charge trapping dielectric flash EEPROM memory cells are constructed, programmed and read. For example, a conventional ONO EEPROM memory cell is shown in FIG. 1 and is disclosed in the technical article entitled "A True Single-Transistor Oxide-Nitride-Oxide EEPROM Device," T. X. Chan, K. K. Young and Chenming Hu, IEEE Electron Device Letters, March 1987, incorporated herein by reference. The memory cell 41 comprises a P-type silicon substrate 30, two PN junctions between N+ source and drain regions 32, 34 and P type substrate 30, a non-conducting nitride layer 38 sandwiched between the two oxide layers 36, 40 and a polycrystalline conducting layer 42.

To program or write the memory cell 41, voltages are applied to the drain 34 and the gate 42 and the source 32 is grounded. For example, 10V is applied to the gate and 5V is applied to the drain. These voltages generate a vertical and lateral electric field along the length of the channel from the source to the drain. This electric field causes electrons to be drawn off the source and begin accelerating toward the drain. As they move along the length of the channel, they gain energy. If they gain enough energy, they are able to jump over the potential barrier of the oxide layer 36 into the silicon nitride layer 38 and become trapped. The probability of this occurring is a maximum in the region of the gate next to the drain 34 because it is near the drain that the electrons gain the most energy. These accelerated electrons are termed hot electrons and once injected into the nitride layer 38 they become trapped and remain stored there. The trapped electrons cannot spread through the nitride layer 38 because of the low conductivity of the nitride layer 38 and the low lateral electric field in the nitride layer. Thus, the trapped charge remains in a localized trapping region in the nitride layer 38 typically located close to the drain 34.

In order to achieve an effective delta in threshold voltage between the unprogrammed and the programmed state of each cell, the charge trapping region of prior art flash EEPROM cells must be made fairly wide. Thus, electrons are trapped in areas far from the drain which directly affects the effectiveness of the erase. In some cases, the device cannot be erased at all because the charge trapping region was programmed too wide.

In memory cells constructed using a conductive floating gate, the charge that gets injected into the gate is distributed equally across the entire gate. The threshold voltage of the entire gate increases as more and more charge is injected into the gate. The threshold voltage increases because the electrons that become stored in the gate screen the gate voltage from the channel.

In devices with low conductivity or non conductive floating gates like the embodiment shown in FIG. 1, the injection of hot electrons into the silicon nitride layer causes the gate threshold voltage to increase only in the localized trapping region. This is in contrast to the conductive floating gate memory cells of EPROMs and EEPROMs wherein the gate threshold voltage of the entire channel rises as programming time increases. In both conductive and non conductive floating gate memory cell designs, an increase in the gate threshold voltage causes the current flowing through the channel to decrease for a given gate voltage. This reduces programming efficiency by lengthening the programming time. However, due to the localized electron trapping in the non conductive floating gate memory cell design, the programming time is reduced less than with the conductive floating gate memory cell design. The technique of programming flash EEPROM memory cells with either conductive or low conductivity or non conductive floating gates is well known in the art and is currently used to program EEPROM and flash EEPROM memory cells.

The conventional technique of reading both prior art conductive floating gate and non conductive localized trapping gate EEPROM or flash EEPROM memory cells is to apply read voltages to the gate and drain and to ground the source. This is similar to the method of programming with the difference being that lower level voltages are applied during reading than during programming. Since the floating gate is conductive, the trapped charge is distributed evenly throughout the entire floating conductor. In a programmed device, the threshold is therefore high for the entire channel and the process of reading becomes symmetrical. It makes no difference whether voltage is applied to the drain and the source is grounded or vice versa. A similar process is also used to read prior art non conductive localized gate flash EEPROM devices.

The process of programming EPROM and EEPROM memory devices typically includes writing followed by reading. For instance, a short programming pulse is applied to the device followed by a read. The read is actually used to effectively measure the gate threshold voltage. By convention, the gate threshold voltage is measured by applying a voltage to the drain and a separate voltage to the gate, with the voltage on the gate being increased from zero while the channel current flowing from drain to source is measured. The gate voltage that provides 1 pA of channel current is termed the threshold voltage.

Typically, programming pulses (i.e., write pulses) are followed by read cycles wherein the read is performed in the same direction that the programming pulse is applied. This is termed symmetrical programming and reading. Programming stops when the gate threshold voltage has reached a certain predetermined point (i.e., the channel current is reduced to a sufficiently low level). This point is chosen to ensure that a '0' bit can be distinguished from a '1' bit and that a certain data retention time has been achieved.

Figure 2:
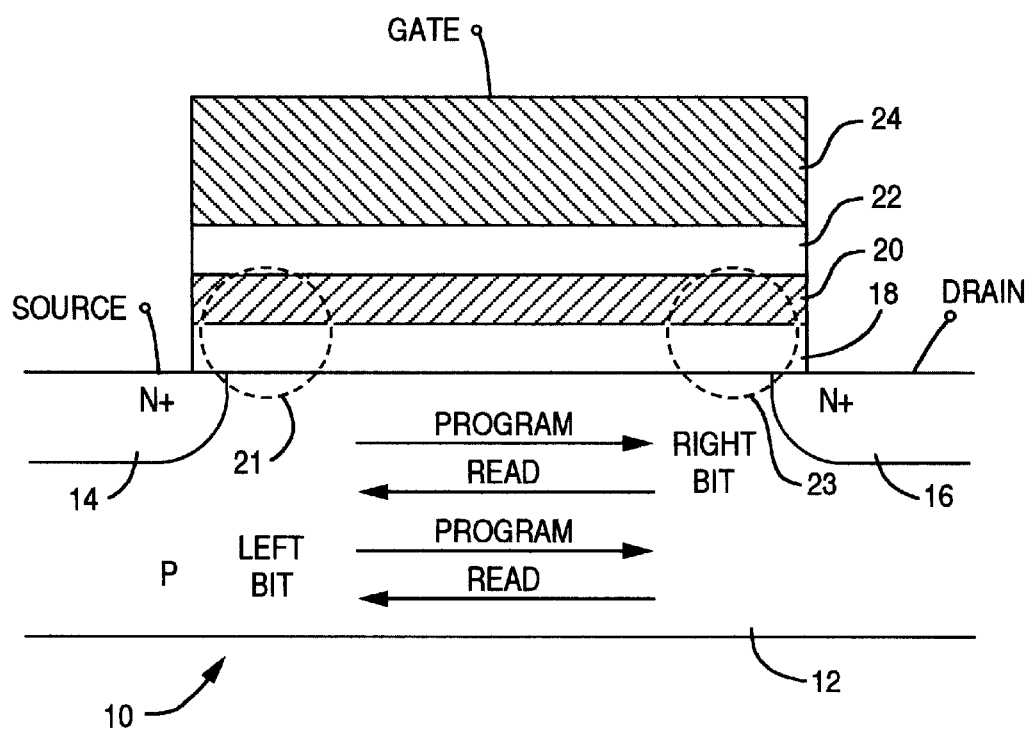
FIG. 2 illustrates a sectional view of a two bit flash EEPROM cell utilizing ONO as the gate dielectric.

An embodiment of a two bit flash EEPROM cell that can utilize a method of erasure in accordance with an embodiment of the present invention is shown in FIG. 2. The flash EEPROM memory cell 10 includes a P-type substrate 12 having two buried PN junctions, one being between the source 14 and substrate 12, termed the left junction and the other being between the drain 16 and the substrate 12, termed the right junction. Above the channel is a layer of silicon dioxide 18 that has a thickness that ranges between approximately 60 to 100 Angstroms, and which forms an electrical isolation layer over the channel. On top of the silicon dioxide layer 18 is a charge trapping layer 20 that has a thickness ranging from 20 to 100 Angstroms thick and preferably is comprised of silicon nitride, $Si_3N_4$. The charge trapping layer can be constructed using silicon nitride, silicon dioxide with buried polysilicon islands or implanted oxide, for example or it can be made of an oxide implanted with arsenic, for example. The hot electrons are trapped as they are injected into the charge trapping layer so that the charge trapping layer serves as the memory retention layer. The thickness of layer 18 is chosen to be in excess of 50 angstrom to prevent electrons from tunneling through the oxide and leaving charge trapping layer 20 during the operation of the cell. Thus the lifetime of the cell of this invention is greatly extended relative to prior art MNOS devices. The memory cell 10 is capable of storing two bits of data, a right bit represented by the dashed circle 23 and a left bit represented by the dashed circle 21.

It is important to note that the two bit memory cell is a symmetrical device. For example, the left junction serves as the source terminal and the right junction serves as the drain terminal for the right bit. Similarly, for the left bit, the right junction serves as the source terminal and the left junction serves as the drain terminal. Thus, the terms left, or first junction and right or second junction are used herein rather than source and drain. When the distinction between left and right bits is not crucial to the particular discussion, the terms source and drain are utilized. However, it should be understood that the source and drain terminals for the second bit are reversed compared to the source and drain terminals for the first bit.

Another layer of silicon dioxide 22 is formed over the charge trapping layer, (i.e., silicon nitride layer), and has a thickness that ranges between approximately 60 to 100 Angstroms thick. The silicon dioxide layer 22 functions to electrically isolate a conductive gate 24 formed over the silicon dioxide layer 22 from charge trapping layer 20. The thickness of gate 24 is approximately 4,000 Angstroms. Gate 24 can be constructed from polycrystalline silicon, commonly known as polysilicon.

Figure 3:
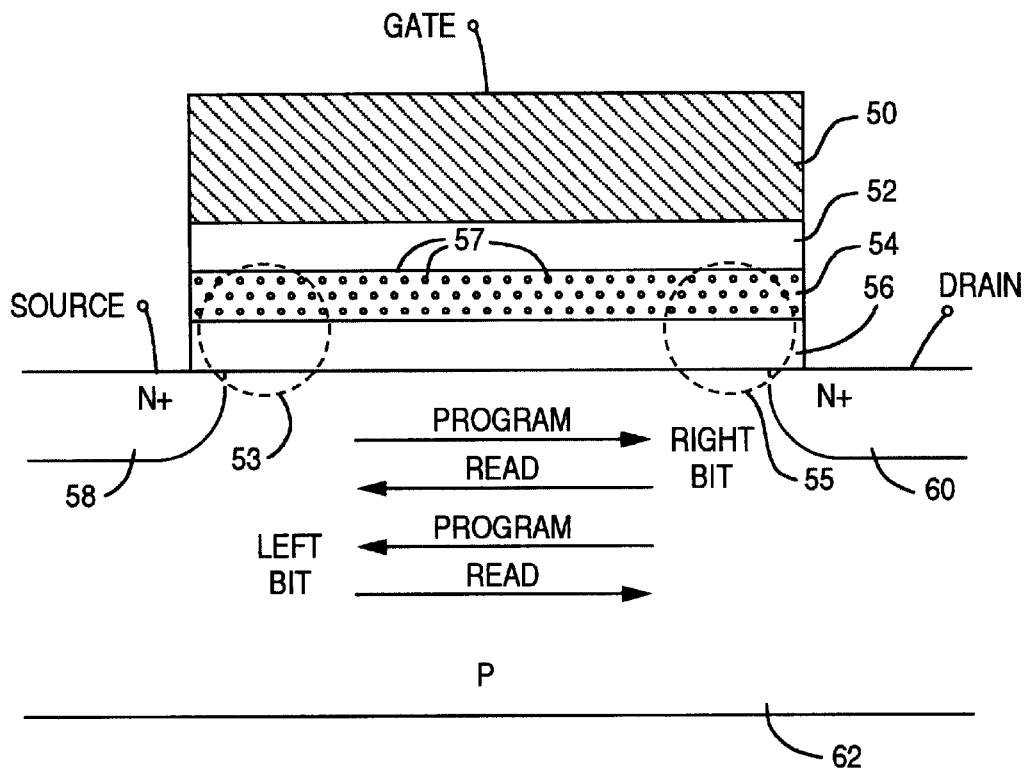
FIG. 3 illustrates a sectional view of a two bit flash EEPROM cell utilizing a silicon rich silicon dioxide with buried polysilicon islands as the gate dielectric.

Charge trapping dielectric materials other than nitride may also be suitable for use as the asymmetric charge trapping medium. One such material is silicon dioxide with buried polysilicon islands. The silicon dioxide with polysilicon islands is sandwiched between two layers of oxide in similar fashion to the construction of the ONO memory cell in FIG. 2. A sectional view of such a two bit flash EEPROM cell is shown in FIG. 3 where there is a silicon rich silicon dioxide layer 54 with buried polysilicon islands 57 as the gate dielectric is illustrated in FIG. 3. A P-type substrate 62 has buried N+ source 58 and N+ drain 60 regions. The silicon dioxide 54 with buried polysilicon islands 57 is sandwiched between two layers of silicon dioxide 52, 56. Covering oxide layer 52 is polysilicon gate 50. Gate 50 is typically heavily doped with an N-type impurity such as phosphorus in the $10^{19}$ to $10^{20}$ atom/cc range. Similar to the two bit memory cell of FIG. 2, the memory cell of FIG. 3 is capable of storing two data bits, a right bit represented by the dashed circle 55 and a left bit represented by the dashed circle 53. The operation of the memory cell of FIG. 3 is similar to that of the memory cell illustrated in FIG. 2 with programming and reading occurring in opposite directions for each bit.

Alternatively, the charge trapping dielectric can be constructed by implanting an impurity, such as arsenic, into a middle layer 54 of silicon dioxide deposited on top of the bottom oxide 56.

Rather than performing symmetrical programming and reading, the flash EEPROM memory cell of FIG. 2 is programmed and read asymmetrically rather than symmetrically as with the cell of FIG. 1. This means that programming and reading occur in opposite directions as denoted by the oppositely pointing arrows labeled PROGRAM and READ for each bit (i.e. the left bit and the right bit) in FIG. 2. Thus, programming is performed in what is termed the forward direction and reading is performed in what is termed the opposite or reverse direction.

It is noted that throughout the discussion of the EEPROM memory cell of the present invention presented below, the voltage levels discussed in connection therewith are assumed to be independent of the power supply voltage. Thus, the power supply voltages supplied to the chip embodying the EEPROM memory device may vary while the voltages applied to the gate, drain and source thereof will be supplied from regulated voltage sources.

As previously mentioned, the flash EEPROM memory cell 10 of FIG. 2 is programmed similarly to the prior art flash EEPROM memory cell of FIG. 1. Voltages are applied to the gate 24 and drain 16 creating vertical and lateral electrical fields which accelerate electrons from the source 14 along the length of the channel. As the electrons move along the channel some of them gain sufficient energy to jump over the potential barrier of the bottom silicon dioxide layer 18 and become trapped in the silicon nitride layer 20. For the right bit, for example, the electron trapping occurs in a region near the drain 16 indicated by the dashed circle 23 in FIG. 2. Thus, the trapped charge is self-aligned to the junction between the drain 16 and the substrate. Electrons are trapped in the portion of nitride layer 20 near but above and self-aligned with the drain region 16 because the electric fields are the strongest there. Thus, the electrons have a maximum probability of being sufficiently energized to jump the potential barrier of the silicon dioxide layer 18 and become trapped in the nitride layer 20 near the drain 16. The threshold voltage of the portion of the channel between the source 14 and drain 16 under the region of trapped charge increases as more electrons are injected into the nitride layer 20.

It is important to note that in order to be able to subsequently erase memory device 10 effectively, the programming time period must be limited. As the device continues to be programmed, the width of the charge trapping region increases. If programming continues past a certain point the charge trapping region becomes too wide whereby erasing is ineffective in removing trapped charge from the nitride layer 20.

However, by reading in the reverse direction an amplification of the effect of the trapped charge injected into the nitride layer results and which leads to dramatically shortened programming times. Reading in the reverse direction permits a much narrower charge trapping region. This in turn greatly increases the erase efficiency since fewer electrons need to be removed to erase the device. In addition, the trapped electrons are stored in a narrower region near the drain also improving the effectiveness of the erase.

Figure 4A:
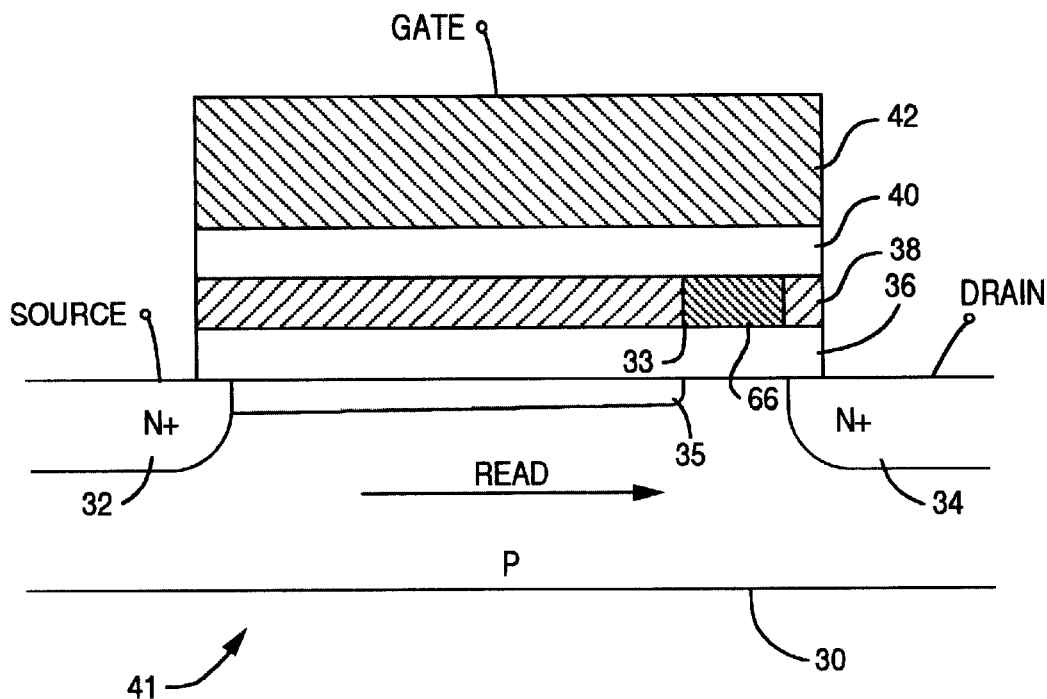
FIG. 4A illustrates a sectional view of a flash EEPROM cell of the prior art showing the area of charge trapping under the gate.
Figure 4B:
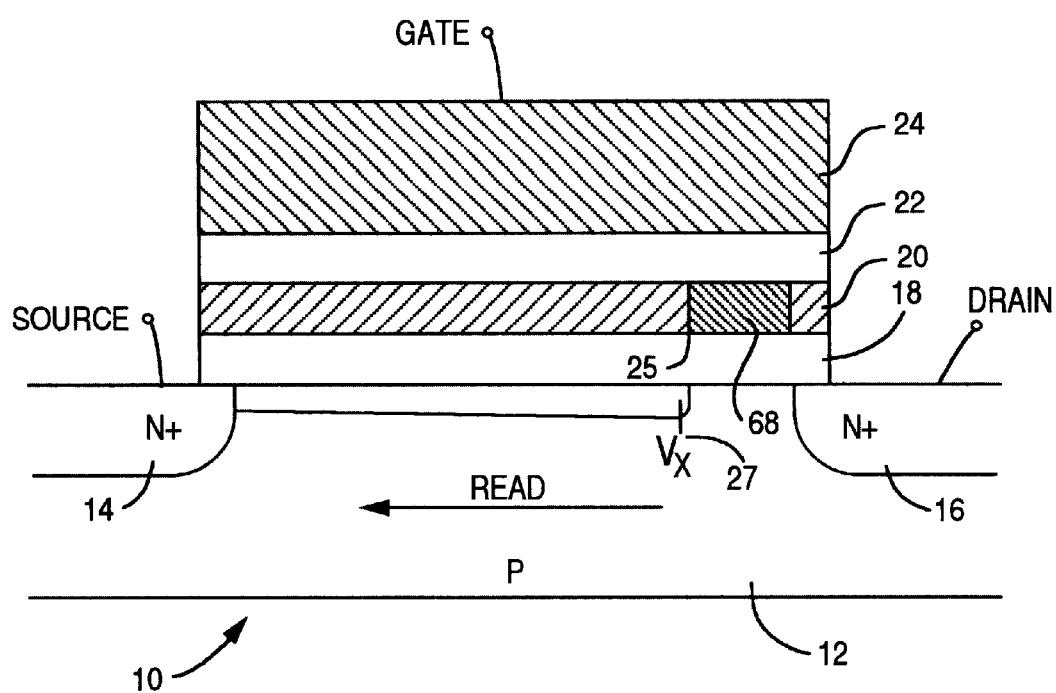
FIG. 4B illustrates a sectional view of a two bit flash EEPROM cell showing the area of charge trapping under the gate.

A description of what occurs during programming is presented first followed by what occurs during reading. Note that the description that follows also pertains to the memory cell of FIG. 3 comprising the silicon dioxide layer 54 having buried polysilicon islands 57 substituting for the nitride layer 20 of FIG. 2. During programming, hot electrons are injected into the nitride layer 20, as described above. Since the nitride 20 is a nonconductor, the trapped charge remains localized to the region near the drain 34 (FIG. 4A) or 16 (FIG. 4B). The region of trapped charge is indicated by the cross hatched area 66 in FIG. 4A and by the cross hatched area 68 in FIG. 4B. Thus, the threshold voltage rises, for example, to approximately 4 V, only in the portion of the channel under the trapped charge. The threshold voltage of the remainder of the channel under the gate remains at, for example, approximately 1 V.

In order to read the flash EEPROM memory cell 10 (FIG. 4B) in the reverse direction, i.e., the direction opposite that of programming, voltages are applied to the source 14 and the gate 24 and the drain 16 is grounded. Similar to the prior art memory device of FIG. 4A, the memory device of FIG. 4B is programmed in the forward direction by injecting hot electrons into region 68 of the nitride layer 20. Since nitride 20 is a nonconductor, the trapped charge remains localized to the region near the drain, for the right bit, for example. The left bit is similar except that source and drain functionality are reversed. The region of trapped charge is indicated by the cross hatched area 68 in FIG. 4B. Thus, the threshold voltage rises, for example, to approximately 4V only in the portion of the channel under the trapped charge 68. The threshold voltage of the remainder of the channel remains at, for example, approximately 1 V.

To read the right bit of the device of FIG. 4B in the reverse direction, a voltage is applied to the source 14 and the gate 24, for example 2V and 3V, respectively, and the drain 16 is grounded. A major difference between reading in the forward direction and reading in the reverse direction is that when reading in the reverse direction, the gate voltage required to put the channel of the memory device into inversion increases significantly. For the same applied gate voltage of 3V, for example, there will be no inversion but rather the channel of the memory device will be in depletion. The reason for this is that the channel region next to the drain 16 (which functions as the source in read) is not inverted due to the electron charge in region 68 of the nitride 20. The channel adjacent the source 14 (which functions as the drain in read) is not inverted because 2V is applied to the source 14 and the channel, to be inverted, must be inverted relative to 2 V. In the case of reading in the reverse direction, in order to sustain a higher voltage in the channel, a much wider depletion region must be sustained. A wider depletion region translates to more fixed charge that must be compensated for before there can be inversion. When reading in the reverse direction, to achieve a voltage drop across the charge trapping region 66 of the prior art memory device shown in FIG. 4A similar to the voltage drop achieved when reading the same device in the forward direction, a higher gate voltage is required, for example, 4 V. A much higher gate voltage is required to pin the voltage in the channel to a higher voltage, i.e., the 2V that is applied to the source terminal rather than ground. In other words, the present invention recognizes and takes advantage of the fact that for the same magnitude potential across the drain and the source, the voltage across the portion of the channel under the trapped charge region 68 (FIG. 4B) is significantly reduced when reading occurs in a reverse direction to writing (programming) directly resulting in less punch through and greater impact of the programming charge injected in region 68 of the nitride layer 20 (FIG. 4B) on the threshold voltage of the transistor. As an example, for the threshold voltage $V_T$ equaling 3 v during reverse read, a programming time of approximately 2 microseconds is required which is three orders of magnitude less than the programming time required for the same threshold voltage when the cell is read in the forward direction.

By reading in the reverse direction, the amount of charge required to be stored on the nitride to achieve the same increase in threshold voltage in a programmed cell read in the forward direction is reduced in some cases by a factor of two or three. Accordingly, the internal electric fields generated by the charge in the nitride when the memory cell is to be read in the reverse direction are much less than the internal electric fields associated with the charge stored on the nitride when the memory cell is to be read in the forward direction. Consequently electron hopping is exponentially reduced and the small amount of charge stored in the nitride does not disperse laterally through the nitride due to the internally self generated electric fields even during retention bake. Consequently, the memory cell of FIG. 2 does not suffer the degradation in performance and reliability of prior art ONO memory cells like those of FIG. 1 which are programmed and read in the same direction.

In programming the two bit cell, each bit, i.e., the left and right bit, is treated as if the device was a single bit device. For the right bit, for example, programming voltages are applied to the gate 24 and drain 16 and hot electrons are injected into and trapped in the charge trapping layer 20 in the region near the drain defined by the dashed circle 23. Correspondingly, the threshold voltage of the portion of the channel under the trapped charge increases as more and more electrons are injected in the nitride layer. The programming of the right bit is represented in FIG. 2 by the right-pointing arrow labeled 'PROGRAM.' This arrow represents the flow of electrons to the right during programming of the right bit.

Similarly, the left bit is programmed by applying programming voltages to the gate 24 and source 14, which now functions as the drain for the left bit. Hot electrons are injected into and trapped in the charge trapping layer 20 in the region defined by the dashed circle 21. The threshold voltage of the portion of the channel under the trapped charge comprising the left bit increases as more and more electrons are injected into the nitride layer. The programming of the left bit is represented in FIG. 2 by the left-pointing arrow labeled 'PROGRAM.' This arrow represents the flow of electrons to the left during programming of the left bit.

The threshold voltage for a programmed left bit will be relatively low compared to the threshold voltage for the right bit and thus the state of the right bit can be read without interference from the left bit. During programming of the right bit, the unprogrammed left bit remains unprogrammed.

Programming the right bit does not affect the unprogrammed left bit. During a second pass or phase, the left bit is programmed and the right bit remains programmed and can still be read. The gate voltage during programming is sufficiently high (typically around 10V) that the programmed right bit does not interfere with the programming of the left bit except to increase somewhat the time required to reach a given threshold voltage relative to the time required to reach the same threshold voltage for the right bit when the right bit is programmed. In addition, the right bit can be programmed through during programming of the left bit. Further, the programming of the left bit does not disturb the programmed right bit. This is possible because program through (i.e. the programming of the one bit substantially without interference from the other bit when the other bit is programmed) and read through (i.e. the reading of one bit without interference from the other bit when the other bit is programmed) occurs through both the left and the right bits.

Program through and read through are possible due to the relatively low gate voltages required to turn on each programmed bit when read in the forward direction as occurs when the other bit is read in the reverse direction. Another way to look at this is that a narrow charge trapping region permits punch through to be more effective. Thus the small amount of charge 68 trapped on the right edge of charge trapping layer 20 (FIG. 5) and self-aligned with the junction between region 16 and the substrate 12 and a comparable amount of charge 70 trapped on the left edge of charge trapping layer 20 and self-aligned with the junction between region 14 and the substrate 12 cause a narrow charge trapping region to be formed at both the right side and the left side of charge trapping layer 20 which is easy to be punched through when the bit is read in the forward direction. Thus when left bit 70 (the charge trapping region 70 is referred to as a bit because the presence or absence of charge in region 70 would represent either a zero or a one) is read in the forward direction, bit 68 is being read in the reverse direction. The punch-through under charge trap region 70 is quite easily achieved with a low gate voltage thereby allowing the charge trapped in bit 68 to control the state of the signal read out of the device. Thus for equal amounts of charge trapped in regions 70 and 68, reading a bit in the reverse direction results in the opposite bit having no effect on the state of the signal being read.

Another reason that the bit not being programmed is not disturbed is that the programming voltage is not being applied to the drain for the bit previously programmed. When programming the other bit, the programming voltage is applied to the drain for the bit on the other side of the device.

As discussed earlier, the programming duration must be limited for each bit in order the other bit can still be read. For example, in the case when the right bit is programmed, i.e., a logic '0', and the left bit is not programmed, i.e., a logic '1', if the right bit was programmed for too long a time then when the left bit is read, there may be insufficient current for the sense amps to detect a logic '1' because the channel is not sufficiently conductive. In other words, if the right bit is programmed too long, a left logic '1' bit becomes slower, i.e., takes longer to read due to lower channel current, or, in the worst case, may appear to be a logic '0' because the over-programmed right bit prevents the left bit from being read. Thus, a window exists in the programming time within which a logic '0' bit must fall. One of the variable parameters is the voltage that is applied to the functional drain region during read. As the drain voltage is increased, a longer programming time, i.e., longer area of trapped charge, is required in order to avoid punch through. Thus, a longer trapping region is equivalent to increasing the programming time. The upper limit of the programming time for the window is the programming time such that a forward read does not change the read current by more than a predetermined percentage compared to the read current for a reverse read. Preferably, the percentage change to the read current should be limited to 10%. This percentage, although not arbitrary, can be optimized according to the design goals of the chip designer. For example, a designer may wish to have three orders of magnitude margin between the threshold voltage of a forward read and the threshold for a reverse read. To achieve this, the gate voltage, drain voltage and implant level are all adjusted accordingly to determine a maximum programming time.

The effect of programming one of the bits is that both programming and reading for the second bit is slowed somewhat. The second bit can be programmed as long as the gate voltage during programming is higher than the threshold voltage of the channel with the first bit programmed and sufficient voltage is placed on the drain. The channel resistance, however, is raised due to the programming of the first bit. As long as programming parameters are tuned properly, the higher channel resistance does not prevent the second bit from being programmed and read. The higher channel resistance, however, does cause programming and reading of the second bit to take longer.

Figure 5:
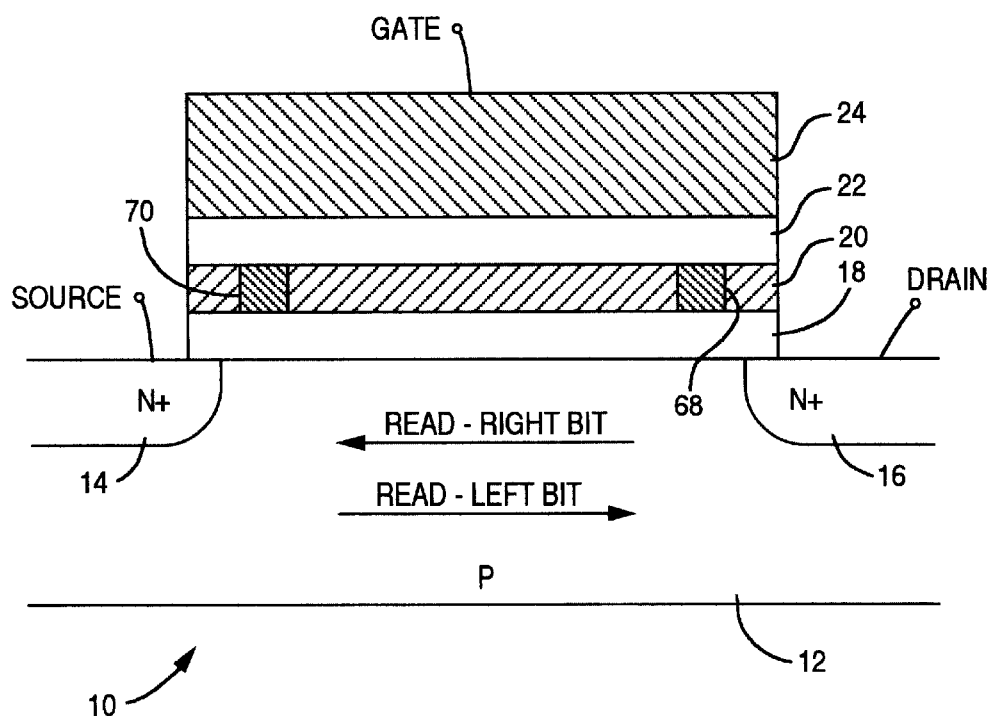
FIG. 5 is a sectional view of a two bit EEPROM cell showing the area of charge trapping under the gate for both the right and the left bus.

Reading the two bit cell of FIG. 5, as in programming, each bit is treated as if the device was a single bit device. The area of trapping for the right bit is reference 68 and that of the left bit is referenced 70. Also shown in FIG. 5 are two arrows labeled 'READ', one pointed in the left direction indicating the direction for reading of the right bit and one pointed in the right direction indicating the direction for reading of the left bit.

The right bit is read in the reverse direction by applying read voltages to the source 14 and the gate 24 and grounding the drain 16. For example, a gate voltage of 3V and a source voltage of 2V is applied. The resulting voltage in the channel $V_X$ will be something less than two volts. Similarly, to read the left bit in the reverse direction, read voltages are applied to the gate 234 and to the drain 16 and the source 14 is grounded, e.g., 3V on the gate and 2V on the drain.

If the drain voltage $V_D$ is made too low and the first bit is programmed, insufficient voltage exists in the channel for read through to occur. In addition, the second bit to be programmed, in this case the left bit, experiences slower programming due to the increased series resistance of the channel. Even if the second bit is unprogrammed, when the drain voltage is too low and the first bit is programmed, the second bit cannot be read properly. Insufficient voltage exists in order for punch through to occur. If punch through does not occur, the second bit looks as if it is programmed whether it really is or not.

Punch through is very sensitive to the length of the trapped charge region, such as regions 68 and 70 of the structure shown in FIG. 5. Should these regions be too wide or not self-aligned with the appropriate region 16 or 14 (depending on whether the charge represents the right bit 68 or the left bit 70), then punch through would not be able to be guaranteed to occur and this concept would not work. Thus, the self-alignment of the trapped charge to the junction between region 16 and the substrate (for the trapped charge 68) and region 14 and the substrate (for the trapped charge region 70) is crucial to the functioning of this invention.

A read of the two bit memory device of the present invention falls into one of three cases: (1) neither of the two bits are programmed (2) one of the bits is programmed and the other is not or (3) both of the bits are programmed. The first case does not require a read through. The second case requires reading through the programmed bit to read the unprogrammed bit. In this case the margin is the delta between reading a single bit in the forward direction versus the reverse direction.

The third case requires read through to read both programmed bits. Programming the second bit, in fact, improves the conditions for reading the first bit. This is so because the voltage in the channel is further reduced over the case of reading a single bit. This increases the read margins between programmed and unprogrammed bits.

It is important to note that although the EEPROM cell of FIG. 5 stores two bits, support circuitry and concepts designed to work with single bit memory cells can still be used. For example, the sense amplifier circuitry needed for the two bit memory cell is basically no different than that for the single bit memory cell. In the single bit memory cell, the sense amplifier circuitry is required to distinguish between two states, the programmed and unprogrammed states. Likewise, in the two bit memory cell of FIG. 5, the sense amplifiers must also distinguish between only two states: programmed and unprogrammed. Accurately detecting multiple current levels in a memory device is a complex and difficult task to accomplish. The memory cell of FIG. 5, requires that the sense amplifiers only distinguish between two states as in the single bit memory cell.

In the case when one of the bits is unprogrammed, i.e., no charge injected into charge trapping layer for that bit, a read of the other bit will be unaffected by this unprogrammed bit. On the other hand, however, in the case when one bit is programmed, a read of the other bit will be affected by this other programmed bit to some extent. Depending on various process parameters, the programmed bit may cause the channel to be less conductive. However, as long as the channel is sufficiently conductive both bits can still be programmed and read correctly.

With reference to FIG. 5, the two bit memory device of the present invention utilizes a punch through or read through technique to read one bit when the other bit is in a programmed state. In order to read, for example, the right bit 68, the read current must be able to read through or punch through the left bit 70, assuming that both the left bit and the right bit have been programmed. Thus, there is a limit on the length of the charge trapping region that can be programmed. The charge trapping region must be short enough to permit punch through of the bit not being read. If a bit is in the unprogrammed state, there is no constraint on the read current of the other bit from the unprogrammed bit.

It is important to note that when a semiconductor device is scaled, the channel lengths become shorter and short channel effects take hold. Thus, in the two bit memory cell, because each bit is stored in different areas of the transistor, short channel effects may become prevalent sooner than in the case of the single bit transistor. In order to retain the usable range of drain voltage, the two bit transistor may need to be scaled by a smaller factor.

A key concept associated with the two bit EEPROM memory cell of FIG. 5 is that for the device to operate properly, both bits must be able to be written and read. If one of the bits is programmed, a reverse read on the programmed bit must sense a high $V_T$, i.e., a '0' and a reverse read on the unprogrammed bit must sense a low $V_T$, i.e., a '1'. Thus, a reverse read on the unprogrammed bit, which is equivalent to a forward read on the programmed bit, must punch through the region of trapped charge in order to generate a high enough read current. If this does not happen, the unprogrammed bit will not be able to be read as a '1', i.e., a conductive bit.

In order to achieve this goal, a sufficient margin is generated between reading in the forward and reverse directions. In order to store two bits, there must be sufficient difference between forward read of one of the bits and reverse read of the other bit. In addition, the reverse read current for one of the bits when the other bit is and is not programmed should be sufficient to distinguish between the two bits. For example, for a gate voltage of 3V, punch through for reading in the reverse direction occurs at approximately 1V. Thus, a drain voltage of 1.6V creates a suitable safety margin ensuring that the second bit can be read when the first bit is programmed.

There are two parameters that can be used to ensure punch through of the charge trapping region. The first is the $V_G$, applied during reading and the second is the width of the charge trapping region. A low $V_G$ used during reading combined with a narrow charge trapping region makes a punch through more effective. The lower gate voltage produces a weaker vertical electric field which causes the lateral electric field to be stronger.

It is more important to use a low $V_G$ during reading in the two bit memory cell than in the single bit memory cell. In the single bit case, it only had to be ensured that the reverse read was better than the forward read, meaning that the $V_T$ of a given bit during forward reading was lower than the $V_T$ of this bit during reverse reading. In the two bit case, however, it is not enough that the $V_T$ drops in the forward case, it must drop sufficiently to be able to punch through when reading the other bit. If the delta $V_T$ between the forward and reverse read is not sufficient, one bit cannot be read when the other bit is programmed.

The mechanism used to erase the two bit flash EEPROM memory cell of FIG. 5 involves the movement of electrons as opposed to the movement of holes. For the right bit, an erase is performed by removing electrons from the charge trapping nitride region 68 either through the gate 24 via the top oxide 22 or through the drain 16 via the bottom oxide 18. For the left bit, an erase is performed by removing electrons from the charge trapping nitride region 70 either through the gate 24 via the top oxide 22 or through the source 14 via the bottom oxide 18.

Using the right bit as an example, one technique of erasing is to simultaneously apply a positive voltage potential to the gate 24 and zero potential, i.e., ground, to the drain 16 such that electron tunneling occurs from the charge trapping nitride layer 20 through the top oxide 22 to the gate 24. The right bit is erased in a similar fashion with zero potential applied to the source 14. In this case, the top oxide 22 is suitably constructed (again with a thickness of about seventy (70) Angstroms) to optimize the tunneling of electrons from the nitride charge trapping layer 20 into the gate 24 in order to facilitate the erasing of the memory cell 10. In one embodiment, the top oxide 22 has a thickness of 50 Angstroms to 80 Angstroms for a voltage on gate 24 of 10 to 18 volts.

Using the right bit as an example, a second technique of erasing the memory cell of FIG. 5 is to simultaneously apply a negative potential to the gate 24 and a positive potential to the drain 16 such that electron tunneling occurs from the charge trapping nitride layer 20 to the drain 16 via the bottom oxide 18. The left bit is erased in a similar fashion except that a positive potential is applied to the source 14 rather than the drain 16. The electron tunneling is substantially confined to a local area near the drain 16. To facilitate the erasing of the memory cell 10 using this technique, the thickness of the bottom layer 18 is suitably constructed (i.e., has a thickness of about seventy (70) Angstroms) to optimize the removal of electrons from the nitride charge trapping layer 20 into the drain 16.

Figure 6:
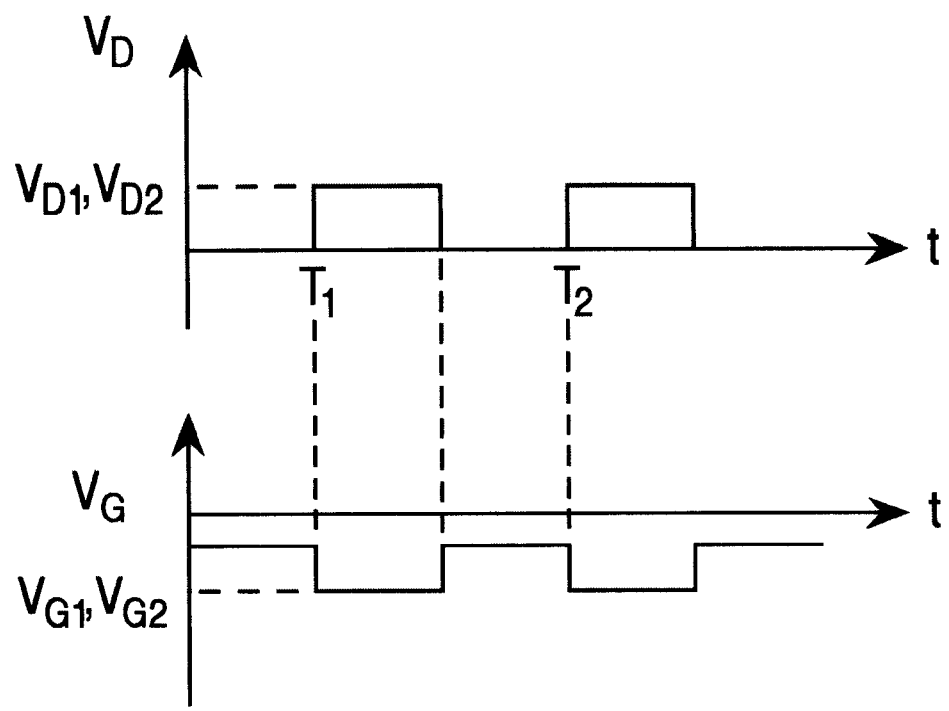
FIG. 6 is one example of a timing diagram for an erase sequence for the EEPROM cells of FIGS. 2, 3, 4B and 5.

As shown in FIG. 6, the second erasing technique involves simultaneously applying at time $T_1$ a first positive voltage pulse $V_{D1}$ to the drain and a first negative voltage pulse $V_{G1}$ at the gate. After the voltages are applied to the drain and gate, it is determined whether or not the cell has been erased. If it has not, a second positive voltage pulse $V_{D2}$ is applied to the drain and a second negative voltage pulse $V_{G2}$ at the gate at time $T_2$. Again, it is determined whether or not the cell has been erased. If it has not, the cycle is repeated until the cell is erased. As shown in FIG. 6, the magnitude of the drain voltages and the gate voltages are unchanged during each cycle. One disadvantage of this technique is that the cell becomes degraded as the number of cycles needed to erase the cell becomes larger.

Figure 7:
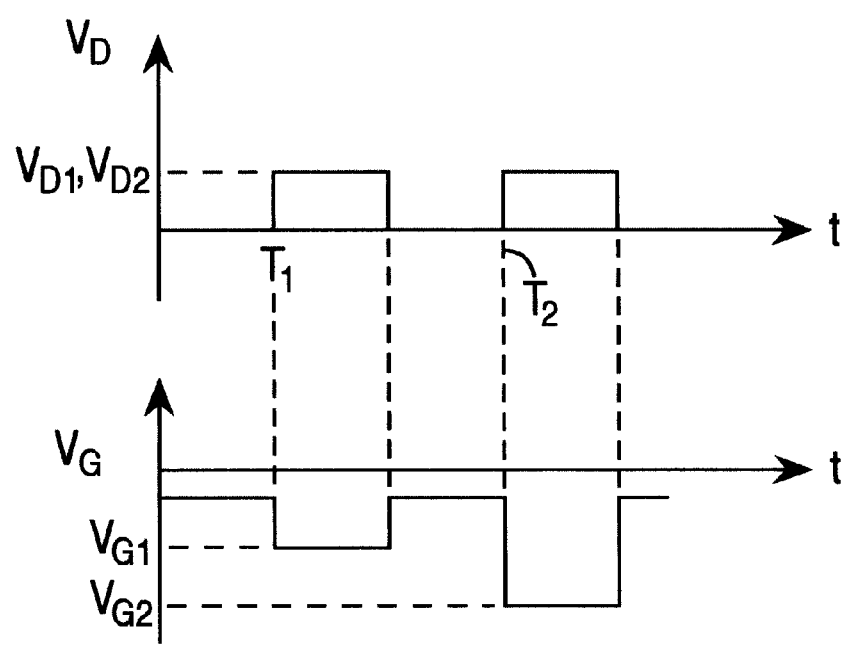
FIG. 7 is an example of a timing diagram for a second erase sequence for the EEPROM cells of FIGS. 2, 3, 4B and 5.

A third technique of erasing the memory cell of FIG. 5 that is related to the second technique but reduces the likelihood of cell degradation is shown in FIG. 7 and is described in U.S. patent application Ser. No. 09/504,695, by Narbeh Derhacobian et al., entitled "Method of Erasing Non-Volatile Memory Cells", filed Feb. 16, 2000, now. U.S. Pat. No. 6,266,281, the entire contents of which are incorporated herein by reference. Like the second erasing technique, the third erasing technique involves simultaneously applying at time $T_1$ a first positive voltage pulse $V_{D1}$ having a magnitude of approximately 3V to 6V and a pulse width ranging from 1 ms to 500 ms to the drain and a first negative voltage pulse $V_{G1}$ of approximately –1V at the gate. After the voltages are applied to the drain and gate, it is determined whether or not the cell has been erased. If the cell is erased, then the erasure technique is discontinued. If it is not, a second positive voltage pulse $V_{D2}$ is applied to the drain and a second negative voltage pulse $V_{G2}$ at the gate at time $T_2$. While the magnitude of the drain voltage remains unchanged like the second technique, the magnitude of the second negative voltage pulse at the gate is greater than the magnitude of the first negative voltage pulse so that a deeper erasure is performed in the second cycle. The magnitude of the second negative pulse has a magnitude of approximately 1.2V. If it is determined after the application of the second negative pulse that the cell is erased, then the erasing technique is discontinued. However, if the cell is found not to be erased, then the magnitude of the gate voltage will be increased once again at time $T_3$ to deepen the erase once again. Since the gate voltage is ramped in the manner described above, the cell is erased in fewer cycles than in the second technique and so the cell is less degraded when subjected to the third erasing technique than the second erasing technique.

Optimization parameters specific to programming and reading two bits in the memory cell of the present invention will now be described. The optimizations for programming include utilizing a longer minimum effective channel length Leer in order to physically separate the two bits better. In addition, the implant level can be reduced in the channel in order to increase the delta between forward and reverse programming. On the other hand, the implant level can be increased in the channel in order to reduce the impact of the first bit on the programming of the second bit. Thus, the implant level in the channel is a compromise between the forward and reverse delta on the one hand and the programming speed on the other hand.

The optimizations for reading include lowering the gate voltage in order to enhance the punch through during reading. As described previously, punch through is necessary to program and read the second bit. A lower implant level in the channel serves to increase punch through. Also, a higher drain voltage during read functions to increase punch through. These three optimizations relate to reading in the forward direction, which is equivalent to reading the second bit in the reverse.

In addition, a lower gate voltage reduces the number of electrons that need to be injected into the charge trapping region. This improves erasing because it eliminates residual charge remaining trapped after erasure. Any residual charge that remains in the charge trapping layer after erasure degrades cycling.

In application, the non-volatile read only memory cells described above are often used in large memory arrays. As the industry need grows for higher density devices capable of storing more and more information in a smaller package, there becomes a need to pack more and more memory cells into these memory arrays. Further, these memory arrays must be made as small as possible. In order to pack more and cells together in a smaller area, the size of the cells, often referred to as the feature size, themselves is typically reduced. Previously, the transistors/cells were oriented horizontally as planar devices with the source and drains of the cells self-aligned with the bit line definition mask. However, reducing the geometric dimensions of the memory cells can adversely affect their electrical performance. In particular, as the channel length is decreased, by bringing the source closer to the drain as the array size was shrunk, the memory cell can fail to block current flow when programmed. This effect is known as "punch through." In avoiding punch through, channel length becomes a critical feature size. Further, reduction in size of the memory cells also lowers their threshold voltages ("Vt"), the voltage at which the cell allows current to pass, due to "Vt roll off", and the cells along with their corresponding columns become leaky, i.e. fail to properly block current flow.

Figure 8:
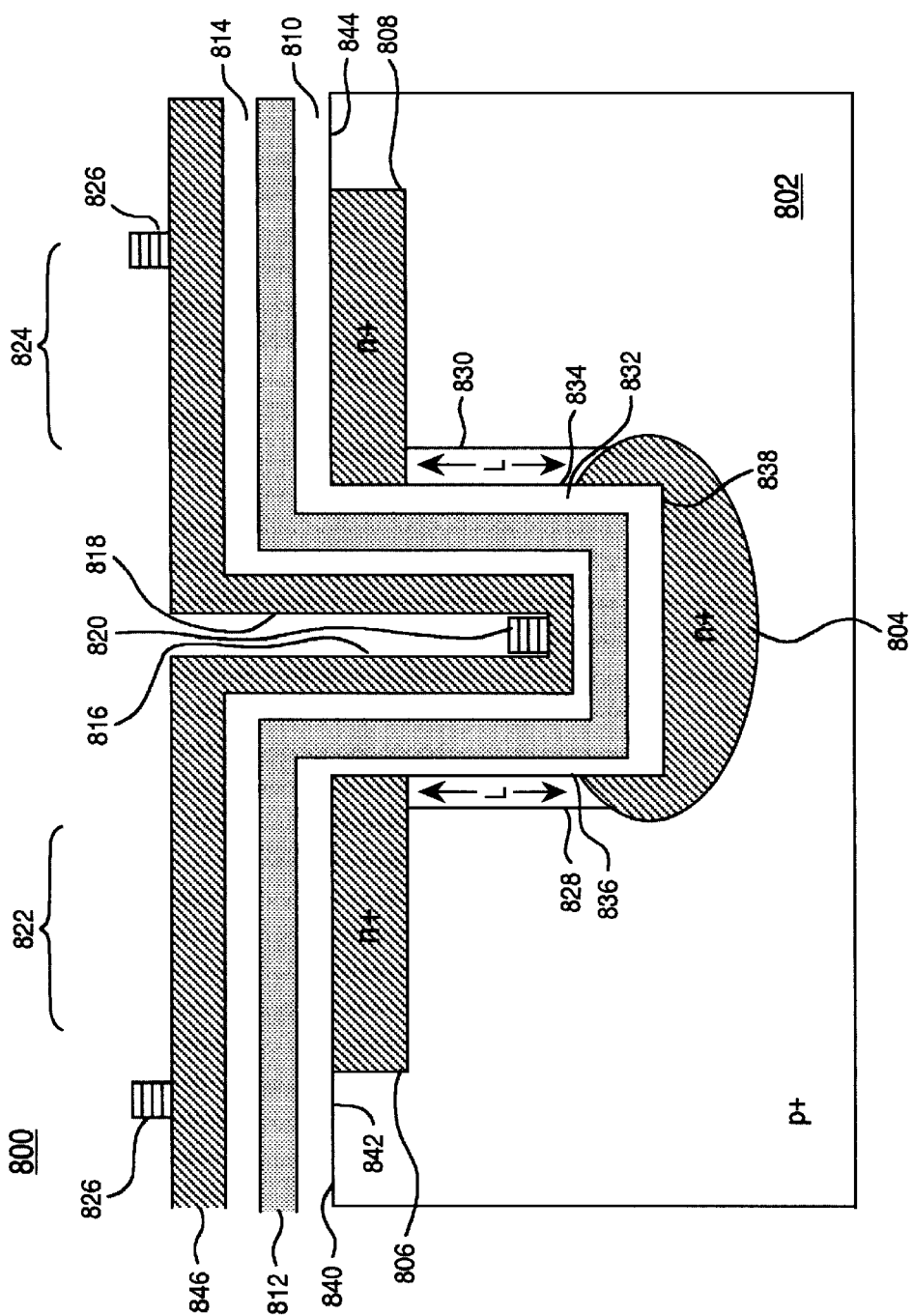
FIG. 8 illustrates a section view of two NROM cells according to a preferred embodiment.

Referring now to FIG. 8, there is shown a sectional view 800 of a preferred embodiment depicting a pair of exemplary n-type non-volatile memory cells 822, 824 fabricated in a p-type substrate 802. In this embodiment, charge is stored in an insulating silicon nitride layer 812. It will be appreciated that alternate materials can be used in fabrication. The substrate 802 includes a trench 832 formed in its surface 840. The trench 834 includes side portions 834 and 836 and a bottom portion 838. Further, the trench defines two top portions 842, 844 in the surface 840 of the substrate which are on either side of the trench 834. The bottom 838 of the trench 834 is substantially parallel to the surface 840 of the substrate 802 and each side 834, 836 is substantially perpendicular to the surface 840 and the bottom 838. In a preferred embodiment, the trench 834 is about 250 nanometers wide and about 250 nanometers deep. It is preferable that the trench 834 run the length of the substrate 802. Alternatively, the trench 834 can only run through a portion of the substrate 802.

In the bottom 838 of the trench 834, an n+ region is fabricated to be the source 804 of the cells 822, 824. In the preferred embodiment, the cells 822, 824 share a common source 804 which also forms part of the memory array interconnect. In top portion 842, another n+ region is fabricated to be the drain 806 of cell 822 and in top portion 844, an n+ region is fabricated to be the drain 808 of cell 824. The channel region 828 for cell 822 is then formed between source 804 and drain 806 in the side portion 836 of the trench 838. The channel region 830 of cell 824 is formed between source 804 and drain 808 in the side portion 834 of the trench 838. As can be seen then, the channels 828 and 830 are vertically oriented, being perpendicular to the source 804 and the drains 806, 808. In this configuration, the channel 828, 830 length is a function of the depth of the trench 834.

FIG. 8 further shows the Silicon Dioxide 810, 814 and Silicon Nitride 812 layers ("ONO" layer) and the polysilicon layer 846 which forms the floating gates 816, 818 of the cells 822, 824. In the preferred embodiments, the cells 822, 824 share a common ONO layer 810, 812, 814 as well as a common polysilicon layer 846. It will be appreciated that the disclosed embodiments can also be used to fabricate independent cells 822, 824 or just a single cell 822, 824.

FIG. 8 further shows the source 804 contact 820 and the drain 806, 808 contacts 826 which provide electrical contact with the cells 822, 824. The contacts 820, 826 are preferably fabricated in the metal layer of the device as is known in the art. It will be appreciated that there are many alternate methods of forming electrical pathways among integrate discrete devices and all are contemplated. In a memory array according to the preferred embodiment, the polysilicon layer 846 forms the word lines of the array. The drain contacts 826 form the bit lines and the source contacts 820 form the source lines.

In order to fabricate cells 822, 824 according to the preferred embodiment, the following fabrication steps could be used.

1. Trench Etch
2. P-well implant (angled)
3. sidewall spacers
4. N+ source and drain implant
5. removal of sidewall spacers
6. fabricate ONO layer stack while maintaining layer quality near trench corners.
7. polysilicon gate deposition
8. trench fill/planarization
9. lithography/etch to define wordlines, especially in the vertical portions of the trenches
10. p-type isolation implant (angled)
11. trench fill/planarization Referring now to FIG. 9, there is shown a perspective showing a portion of an NROM array 900 according to a preferred embodiment. Within each trench 828 are two memory cells 822, 824. The wordlines 902, 904 of the array 900 run across the cells 822, 824 and are coupled with the gates 816, 818 of the cells 822, 824. Herein, the phrase "coupled with" is defined to mean directly connected to or indirectly connected with through one or more intermediate components. Metal contacts 826 also run along the top portions 842, 844 of the trenches 838 and are coupled with the drains 806, 808 acting as the bit lines of the array. Metal contacts 820 run along the bottom of the trench 838 and are coupled with the sources 804 of the cells 822, 824 acting as the source lines of the array 900. As was discussed above, the channel 828, 830 length is dependent on the depth of the trench 834. Therefore, by narrowing the trenches 834, the array can be compacted without adversely affecting the channel 828, 830 length.

In the preferred embodiment, the inter-trench 834 spacing is about 250 nanometers and the inter-row spacing (between successive transistor rows) is about 250 nanometers. Each row has a width (the channel width) of about 250 nanometers. The preferred cell density is about 0.12 micron$^3$ as compared with a typical array fabricated using 0.25 micron process which yields a density of 0.82 micron$^3$.

Figure 9:
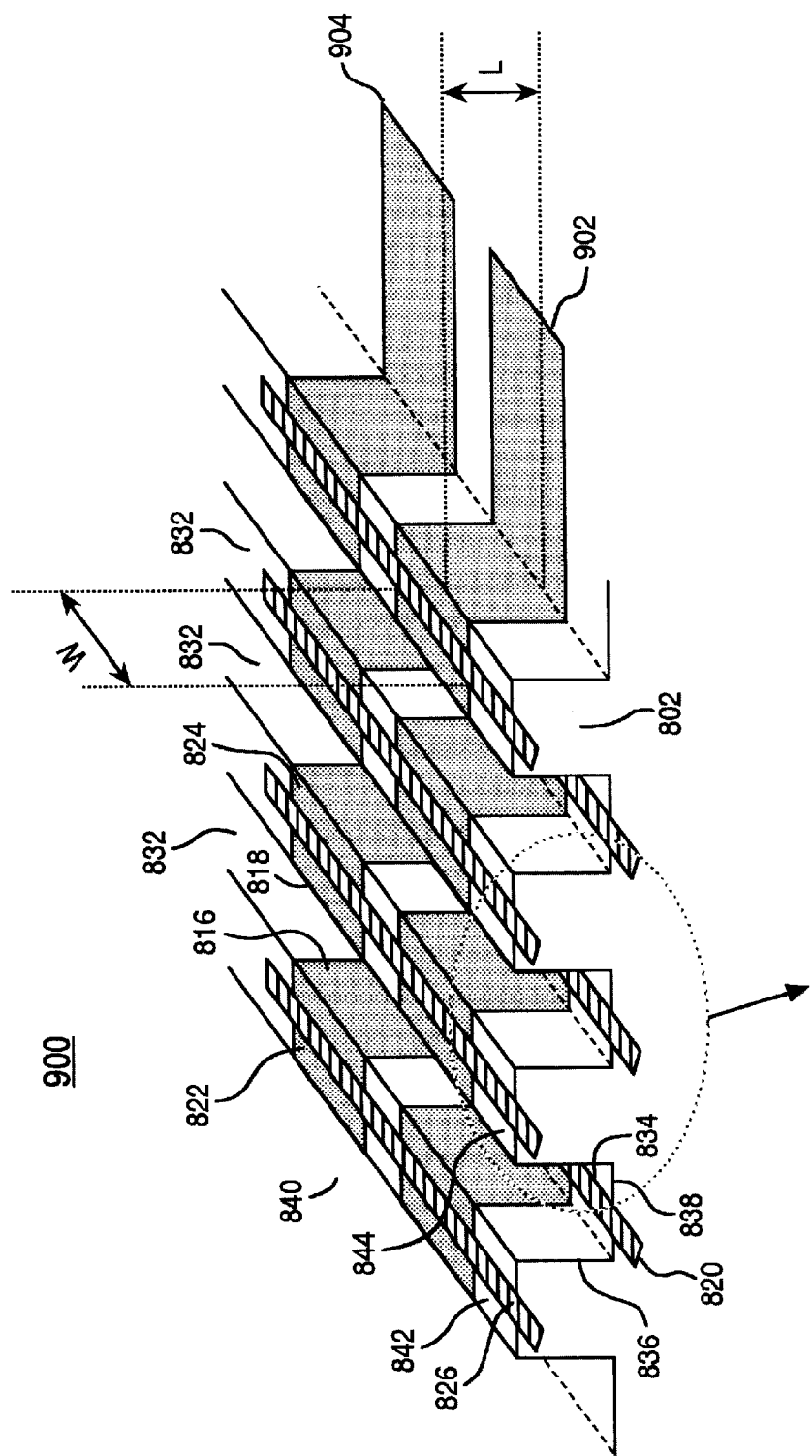
FIG. 9 depicts a perspective diagram showing a portion of an NROM array according to a preferred embodiment.
Figure 10:
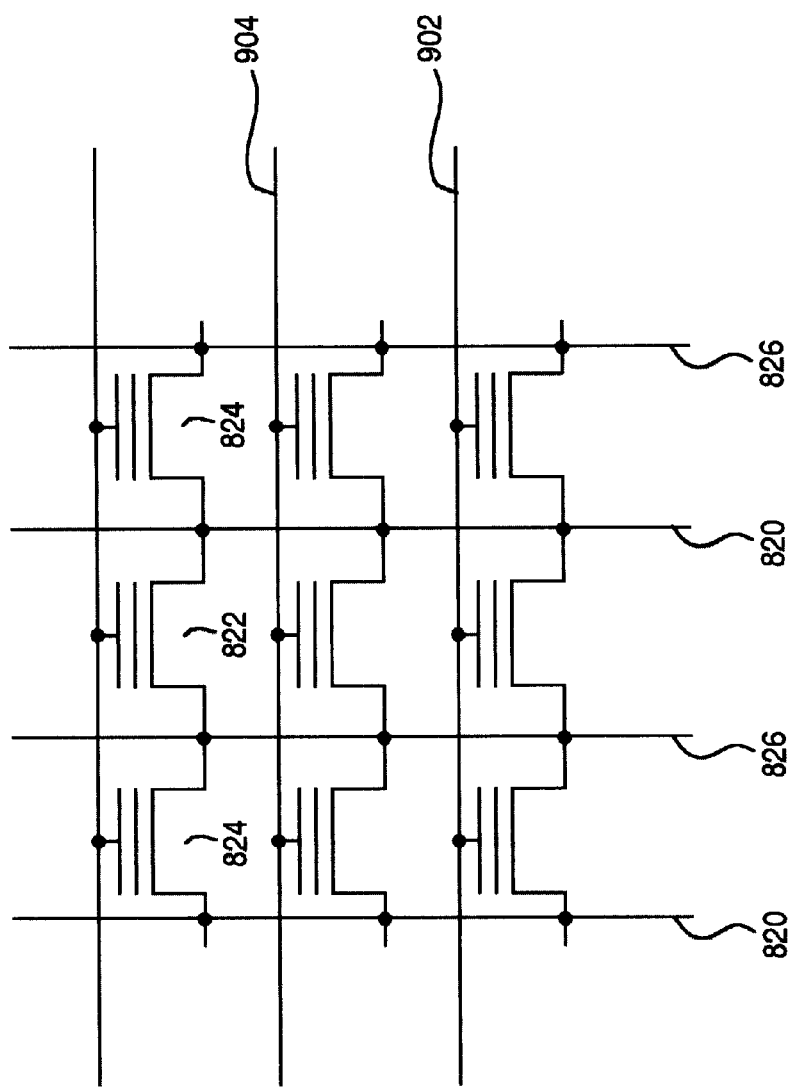
FIG. 10 depicts a schematic diagram representing a portion of the NROM array of FIG. 9.

Referring now to FIG. 10, there is shown a schematic diagram 1000 representing a portion of the NROM array of FIG. 9. The diagram 1000 shows how the array is electrically constructed.

In alternative embodiments, the source may be fabricated on the top of the trench and the drain may be fabricated on the bottom of the trench. Further, a reverse reading scheme, as described above, may be implemented to store multiple bits within a single cell.

It is therefore intended that the foregoing detailed description be regarded as illustrative rather than limiting, and that it be understood that it is the following claims, including all equivalents, that are intended to define the spirit and scope of this invention.

We claim:

1. A non-volatile read only memory transistor comprising:
   a channel region having a first end coupled with a source and a second end coupled with a drain;
   a gate comprising a wordline layer formed in a trench without completely filling said trench;
   said source having a first surface located in a first plane and said drain having a second surface located in a second plane, said second plane being oriented substantially parallel to and non-coplanar with said first plane; and
   wherein said channel region is located in a third plane, said third plane being oriented substantially perpendicular to and non-coplanar with said first and second planes, and wherein said drain overlaps at least a portion of said source.

2. The non-volatile read only memory transistor of claim 1 further comprising an Oxide-Nitride-Oxide ("ONO") layer overlaying said channel.

3. An electronic device comprising:
   one or more non-volatile read only memory transistors, said one or more non-volatile read only memory transistors each comprising:
   a channel having a first end comprising a source and a second end comprising a drain;
   a gate comprising a wordline layer formed in a trench without completely filling said trench;
   said source being located in a first plane and said drain located in a second plane, said second plane being oriented substantially parallel to said first plane; and
   wherein said channel is located in a third plane, said third plane being oriented substantially perpendicular to said first and second planes, and wherein said drain overlaps at least a portion of said source.

4. The electronic device of claim 3, wherein said one or more non-volatile read only memory transistors further comprise an ONO layer overlaying said channel.

5. An electronic device comprising:
   a substrate comprising one or more trenches formed in said substrate, each of said one or more trenches having first and second top portions, a bottom portion oriented substantially parallel to said first and second top portions, a first wall extending between said first top portion and said bottom portion substantially perpendicularly to said bottom and said first top portion and a second wall extending substantially perpendicularly from said second top portion to said bottom portion, said first wall being substantially parallel to said second wall;
   a first non-volatile read only memory transistor, comprising:
   a first channel having a first end comprising a first source and a second end comprising a first drain;
   a first gate comprising a wordline layer formed in one of said trenches without completely filling said trench;
   said first drain being located in said first top portion and said first source being located in said bottom portion; and
   wherein said first channel is located in said first wall, and wherein said first drain overlaps at least a portion of said first source.

6. The electronic device of claim 5, wherein said at least one non-volatile read only memory transistor further comprises an Oxide-Nitride-Oxide ("ONO") layer located overlaying said channel.

7. The electronic device of claim 5, wherein said substrate is characterized by a substantially flat surface and wherein said one or more trenches extend a length of said surface.

8. The electronic device of claim 5, wherein said one or more trenches are each characterized by a depth between said first and second top portions and said bottom portion and further wherein said channel comprises a channel length, said channel length being a function of said depth.

9. The electronic device of claim 5, further comprising a second non-volatile read only memory transistor, comprising:
   a second channel having a third end comprising a second source and a fourth end comprising a second drain;
   said second drain being located in said second top portion and second source being located in said bottom portion; and
   wherein said second channel is located in said second wall.

10. The electronic device of claim 9, wherein said first source is the same as said second source.

11. A non-volatile read only memory transistor comprising:
    a substrate having a substantially planar surface and a trench;
    a gate comprising a wordline layer formed in said trench without completely filling said trench;
    a source region fabricated in said substrate;

a drain region fabricated in said substrate; and a channel region fabricated in said substrate and extending between and connecting said source region and said drain region; and wherein said channel region is out of plane of said source region and said drain region, and wherein said drain region overlaps at least a portion of said source region.

12. The non-volatile read only memory transistor of claim 11, further comprising:

a trench fabricated in said substrate having a bottom portion substantially parallel to said planar surface and a side portion substantially perpendicular to said planar surface and said bottom portion;

wherein said drain region is fabricated substantially adjacent to said trench in said planar surface and said source region is fabricated in said bottom portion, said channel region is fabricated in said side portion.

* * * * *